(12) United States Patent
Yang et al.

(10) Patent No.: US 6,362,560 B1
(45) Date of Patent: Mar. 26, 2002

(54) MULTI-LAYER PIEZOELECTRIC CENTER-DRIVE CERAMIC TRANSFORMER

(76) Inventors: Meng-Chang Yang, 5F, No. 306, Sec. 1, Ta-Tung Rd.; Cheng-Fu Chiu, No. 5, Lane 292, Sec. 1, Ta-Tung Rd., both of Hsi-Chih City, Taipei County (TW)

( * ) Notice: Subject to any disclaimer, the term of this patent is extended or adjusted under 35 U.S.C. 154(b) by 0 days.

(21) Appl. No.: 09/755,908

(22) Filed: Jan. 4, 2001

(51) Int. Cl.$^7$ ...................... H01L 41/047; H01L 41/107
(52) U.S. Cl. ........................................ 310/359; 310/366
(58) Field of Search .................................. 310/359, 366

(56) References Cited

U.S. PATENT DOCUMENTS

| | | | | |
|---|---|---|---|---|
| 5,241,236 A | * | 8/1993 | Sasaki et al. ................ | 310/358 |
| 5,736,807 A | * | 4/1998 | Hakamata et al. ........... | 310/359 |
| 5,751,092 A | * | 5/1998 | Abe ............................ | 310/359 |
| 5,914,556 A | * | 6/1999 | Tabota et al. ................ | 310/359 |
| 5,959,391 A | * | 9/1999 | Ogiso et al. ................. | 310/359 |

FOREIGN PATENT DOCUMENTS

JP      10-200173 A  *  7/1998  .................. 310/359

* cited by examiner

Primary Examiner—Thomas M. Dougherty
(74) Attorney, Agent, or Firm—Ladas & Parry (57) ABSTRACT

A multi-layer piezoelectric center-drive ceramic transformer includes a stack of piezoelectric ceramic blanks sintered together, each piezoelectric ceramic blanks having at least one odd-number layer and at least one even-number layer alternatively sandwiched in between a top cover layer and a bottom cover layer, first and second inner electrode layers reversely printed on the at least one odd-number layer, third and fourth inner electrode layers reversely printed on the at least one even-number layer, first and second output terminal electrodes respectively printed on two distal ends of each piezoelectric ceramic blank, and first and second input terminal electrodes respectively printed on two opposite lateral sides of each piezoelectric ceramic blank, the first input terminal electrodes being respectively connected to the first inner electrode layers and the third inner electrode layers, the second input terminal electrodes being respectively connected to the second inner electrode layers and the fourth inner electrode layers.

12 Claims, 16 Drawing Sheets

MULTI-LAYER PIEZOELECTRIC CENTER-DRIVE CERAMIC TRANSFORMER

BACKGROUND OF THE INVENTION

The present invention relates to a piezoelectric transformer and, more particularly, to a multi-layer piezoelectric center-drive ceramic transformer, in which inner electrode layers of input terminal electrodes are alternatively arranged in different polarities to enhance ½ wavelength resonant mode and to eliminate full-wavelength resonant mode, so as to improve the efficiency of conversion to over 95%.

Figure 1:
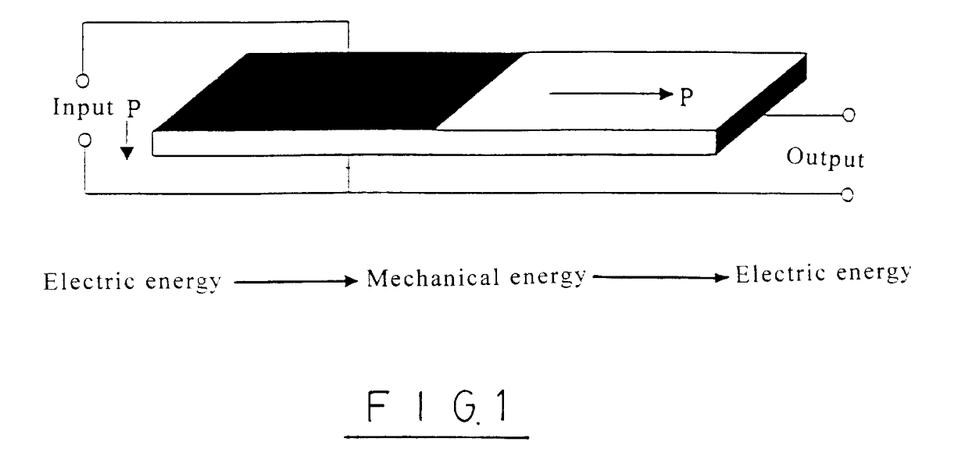
FIG. 1 is a perspective view of a piezoelectric ceramic transformer according to the prior art.

Early in 1956, doctor C. A. Rosen reported a study about a transverse type transformer, namely, the so-called Rosen-type transformer. FIG. 1 shows a Rosen-type transformer. This structure of Rosen-type transformer comprises a narrow, elongated ceramic plate, which is divided into two halves subject to the arrangement of its electrode means (direction of polarity). To a boosting transformer, the driver (input) is formed by: covering a silver electrode on one half of the top side as well as the bottom side along the direction of the length to work as an AC input end. The polarity P extends along the direction of the thickness (of low impedance). The other half (small silver electrode surface area) is the generator, where the silver electrode area is disposed at the end edge to work as an output end. The polarity of the generator extends along the length (of high impedance). Under this transverse-type transformer, when the frequency at the AC input end is equal to the resonant frequency in the direction of the length of the transformer, the transformer is caused to produce a mechanical resonance, i.e., the reverse piezoelectric effect (electric energy→mechanical energy) causes a vibration along the direction of the length, and the mechanical resonance is converted into a voltage at the generator for output due to forward piezoelectric effect. Because the length of the ceramic plate is greater than its thickness, the impedance at the output end (generator) is constantly greater than the input end (driver), and a boosting effect is produced.

Further, because of the resonant effect of the piezoelectric ceramic plate is produced under full-wave frequency, half-wave frequency, as well as 3⁄2-wave frequency, the boosting working can be classified into half-wave mode, full-wave mode, and 3⁄2-wave mode. An apparent boosting effect is seen at every mode frequency. Full-wave and half-wave resonant modes are most commonly adopted. More particularly, the frequency of 40 K~60 KHz for driving a CCFL (cold cathode fluorescent lamp) is based of half-wave mode. During application, a piezoelectric ceramic transformer provides a single resonant mode only to save energy consumption and to obtain better efficiency of conversion. By means of electrode design and support arrangement, a better single mode resonant effect can be achieved to greatly improve the efficiency of conversion.

The boosting ratio of a piezoelectric ceramic transformer is directly proportional to the L/T (length/thickness) ratio of the ceramic plate. When increasing the boosting ratio, the ceramic plate must be made relatively thinner or relatively longer. However, the ceramic plate tends to break when made relatively thinner, or becomes not applicable when made excessively long. In recent years, different multi-layer ceramic fabrication techniques have been well developed for the fabrication of laminated ceramic capacitors, laminated ceramic conductors, laminated ceramic resistors, and the like. By means of the application of a similar laminated ceramic fabrication technique, the size of a single-layer ceramic transformer can be reduced to ⅓. Because the thickness of each individual layer is greatly reduced, the boosting ratio is relatively increased. A laminated ceramic transformer can be used in the fields that require high boosting ration and small installation space (for example, digital camera, thin type notebook computer, or the like). The invention is developed by means of the application of laminated ceramic fabrication techniques.

SUMMARY OF THE INVENTION

It is one object of the present invention to provide a multi-layer center-drive piezoelectric transformer, which employs a multi-layer ceramic sintering technique to sinter a stack of ceramic blanks into a solid member for making a multi-layer center-drive piezoelectric transformer. It is another object of the present invention to provide a multi-layer center-drive ceramic piezoelectric transformer, which keeps inner electrode layers of input terminal electrodes alternatively arranged in different polarities to enhance ½ wavelength resonant mode and to eliminate full-wavelength resonant mode, so as to improve the efficiency of conversion to over 95%. The multi-layer center-drive ceramic piezoelectric transformer comprises A multi-layer center-drive piezoelectric transformer comprising a plurality of piezoelectric ceramic blanks sintered in a stack, the piezoelectric ceramic blanks each comprising a top cover layer, a bottom cover layer and an odd-number layer and an even-number layer sandwiched in between the top cover layer and the bottom cover layer, first and second inner electrode layers of reversed polarities respectively printed on the odd-number layer, third and fourth inner electrode layers of reversed polarities respectively printed on the even-number layer, first and second output terminal electrodes respectively printed on two distal ends of the odd-number layer and even-number layer of each piezoelectric ceramic blank, and first and second input terminal electrodes respectively printed on two opposite lateral sides of each of the odd-number layer and even-number layer of each piezoelectric ceramic blank, the first input terminal electrodes of the odd-number layer and even-number layer of each piezoelectric ceramic blank being respectively connected to the first inner electrode layers and the third inner electrode layers, the second input terminal electrodes of the odd-number layer and even-number layer of each piezoelectric ceramic blank being respectively connected to the second inner electrode layers and the fourth inner electrode layers.

DETAILED DESCRIPTION OF THE PREFERRED EMBODIMENT

Figure 2:
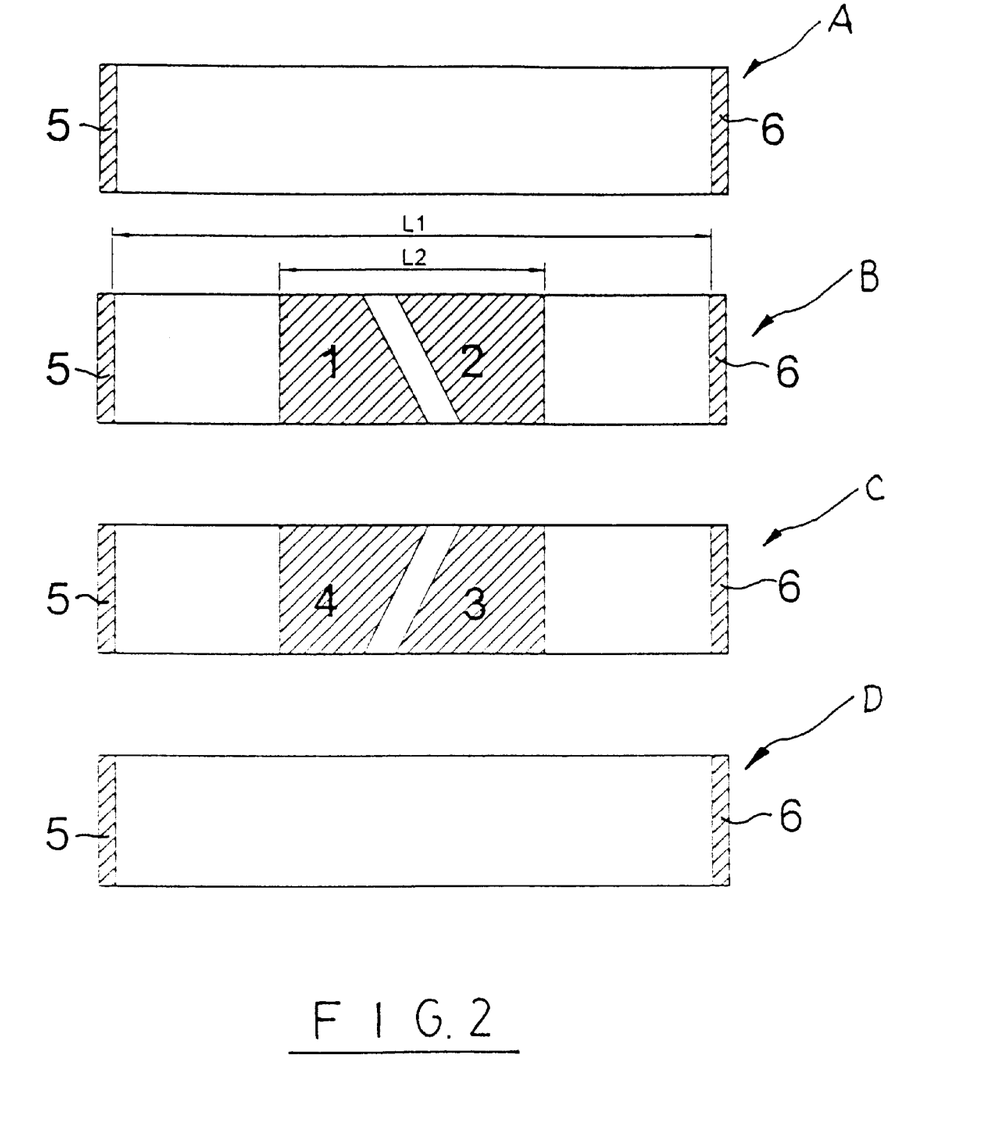
FIG. 2 is a plain view showing electrodes printed on different layers of a piezoelectric ceramic blank (A: top cover layer, B: odd-number layer, C: even-number layer, D: bottom cover layer) according to the present invention.
Figure 3:
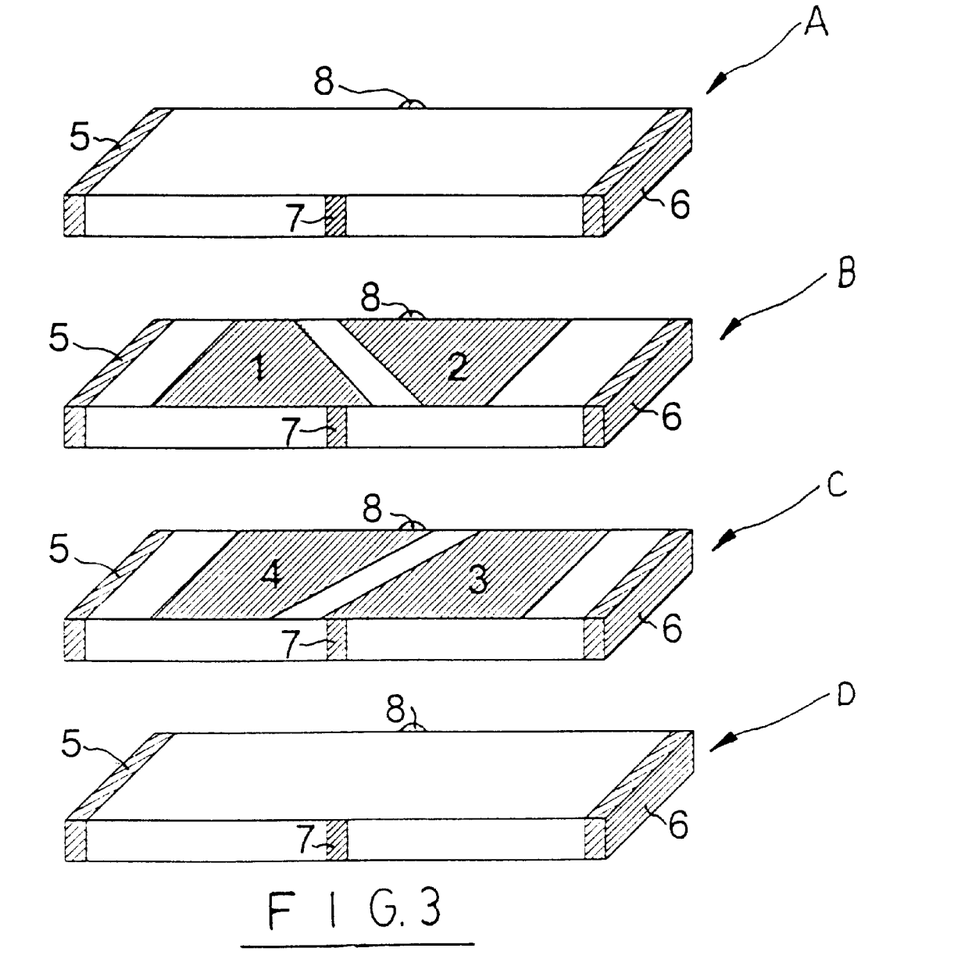
FIG. 3 is a perspective view of the piezoelectric ceramic blank shown of FIG. 2.

Referring to FIGS. 2 and 3, a multi-layer center-drive piezoelectric ceramic transformer in accordance with the present invention is shown comprising multiple rectangular piezoelectric ceramic blanks each formed of a top cover layer A, an odd-number layer B, an even-number layer C, and a bottom cover layer D. The odd-number layer B is printed with two symmetrical, trapezoidal inner electrode layers 1 and 2 of reversed polarities. The even-number layer C is printed with two symmetrical, trapezoidal inner electrode layers 3 and 4 of reversed polarities. The patterns of the trapezoidal inner electrode layers 1 and 2 of the odd-number layer B are symmetrical to the patterns of the trapezoidal inner electrode layers 3 and 4 of the even-number layer C. After the blank has been sintered, output terminal electrodes 5 and 6 are respectively printed on the two distal ends of each of the top cover layer A, the odd-number layer B, the even-number layer C and the bottom cover layer D, and two input terminal electrodes 7 and 8 are respectively printed on the two opposite lateral sides of each of the top cover layer A, the odd-number layer B, the even-number layer C and the bottom cover layer D. The input terminal electrodes 7 of the odd-number layer B and the even-number layer C are respectively connected to the respective trapezoidal inner electrode layers 1 and 3. The input terminal electrodes 8 of the odd-number layer B and the even-number layer C are respectively connected to the respective trapezoidal inner electrode layers 2 and 4. The maximum distance between the trapezoidal inner electrode layers 1 and 2 of the odd-number layer B is L2. The distance between the output terminal electrodes 5 and 6 of the odd-number layer B is L1.

Figure 4:
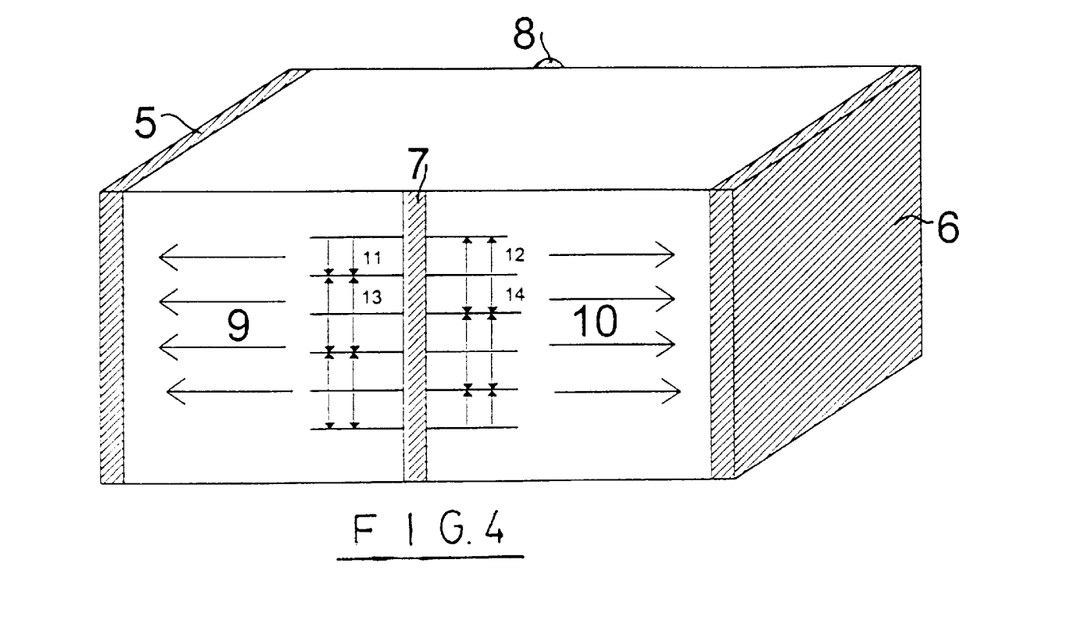
FIG. 4 is a perspective view of a stack of piezoelectric ceramic blanks sintered together, showing reversed polarities of input and output terminals (→: direction of polarity; 11, 12 reversed polarities; 9, 10 reversed polarities).
Figure 5:
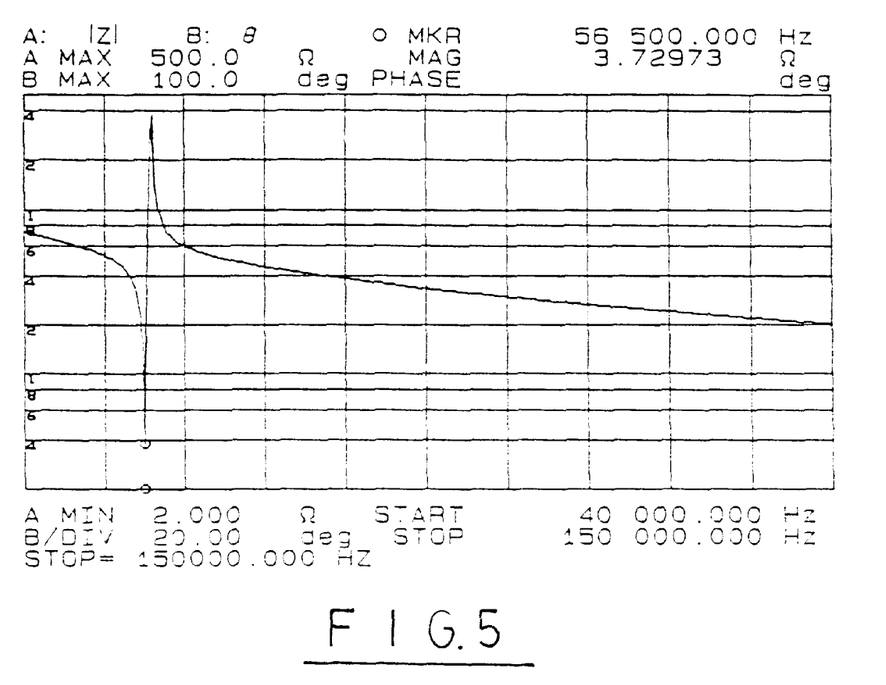
FIG. 5 is a frequency characteristics chart obtained between the input terminals of FIG. 4.

Referring to FIG. 4, a plurality of piezoelectric ceramic blanks of the aforesaid structure are arranged in a stack, enabling the respective input terminal electrodes 7 to be connected to one another at one side and the respective input terminals 8 to be respectively connected to one another at the other side, and then the stack of piezoelectric ceramic blanks are sintered together, forming a multi-layer center-drive piezoelectric ceramic transformer. When finished, the input terminal electrodes 7 are electrically connected to the trapezoidal inner electrode layers 1 and 3, the input terminal electrodes 8 are electrically connected to the trapezoidal electrode layers 2 and 4, the polarities 11 and 12 between the input terminal electrodes 7 and the input terminal electrodes 8 are reversed, the polarities 13 and 14 are reversed, the polarities 11 and 14 are identical, and the polarities 9 and 10 are reversed, i.e., each two vertically spaced as well as horizontally spaced adjacent polarities are reversed. FIG. 5 shows a frequency characteristics chart obtained from the structure shown in FIG. 4.

Figure 6B:
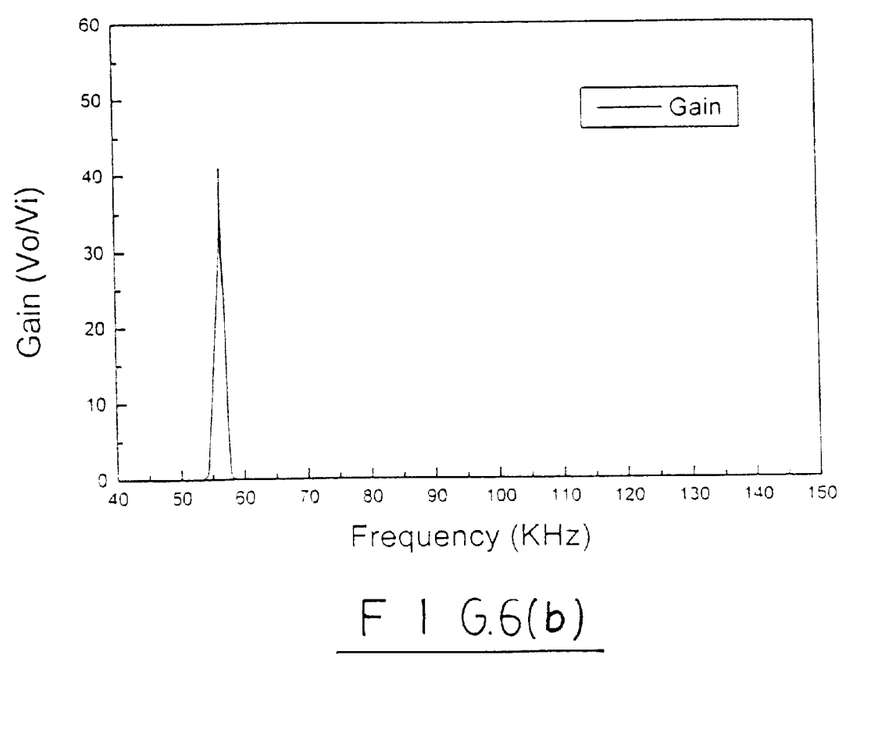
FIG. 6B illustrates voltage output produced in the half-wave resonant mode when the footing ratio of the circuit of FIG. 6A at different frequencies under the load of 50 kΩ.
Figure 6D:
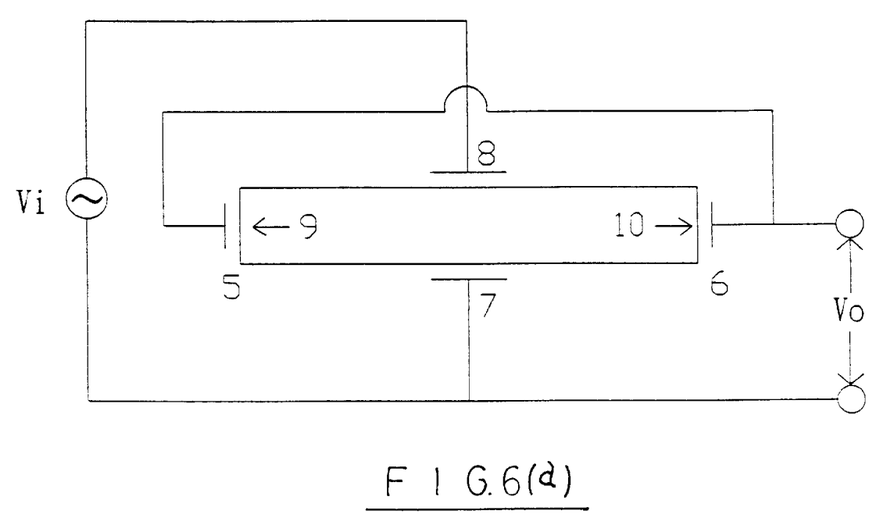
FIG. 6A shows the circuit connection of the piezoelectric ceramic transformer of FIG. 4.
Figure 7:
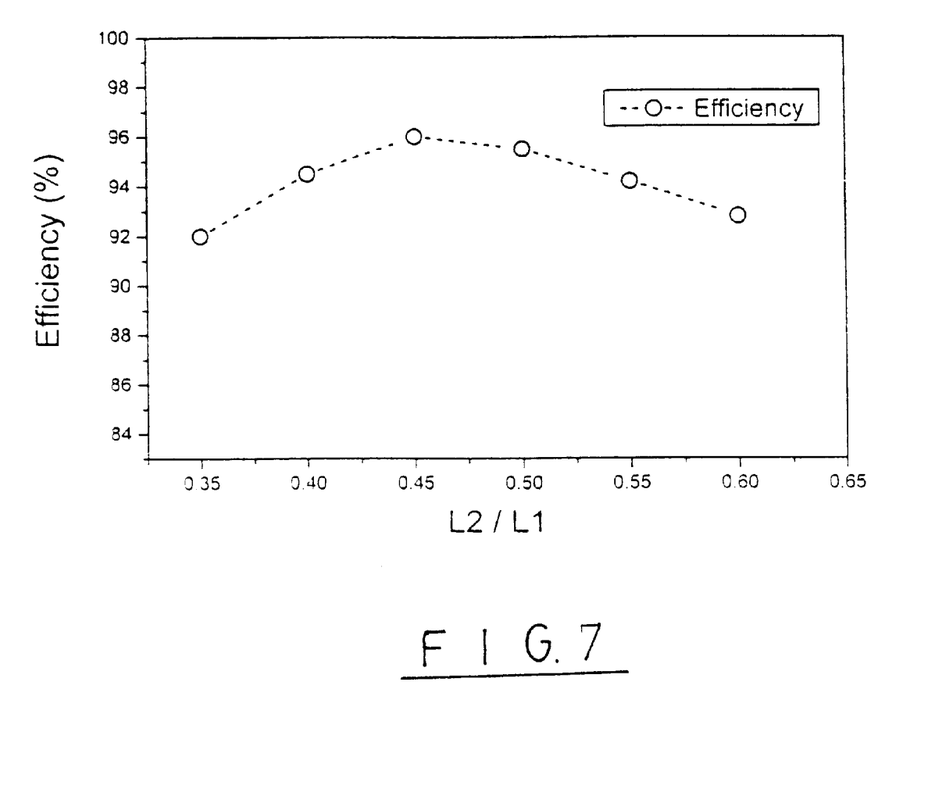
FIG. 7 shows the relationship between L2/L1 ratio of FIG. 2 and the efficiency of conversion under the load of 50 kΩ.

FIG. 6A shows the circuit diagram of the piezoelectric ceramic transformer shown in FIG. 4. As illustrated, when the load of the circuit is at 50 kΩ, the boost ration at different frequencies provides a voltage output only at the half-wave resonant mode (see FIG. 6B). When the load is at 50 kΩ, the relationship between the L2/L1 ratio shown in FIG. 2 and the efficiency of conversion is as shown in FIG. 7.

Figure 8B:
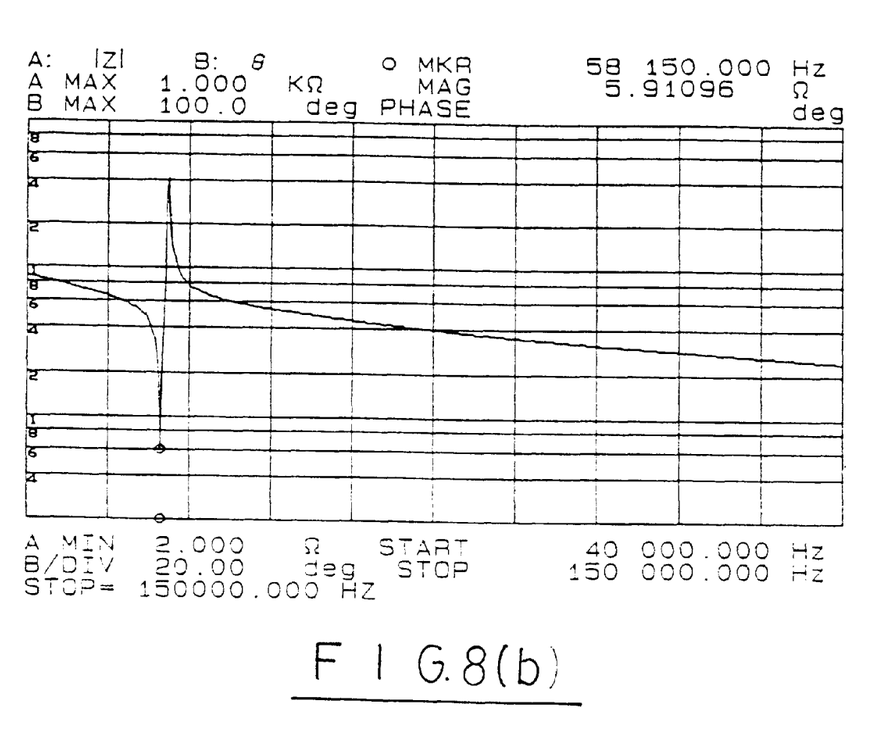
FIG. 8B is a frequency characteristics chart obtained between the input ends according to the present invention.
Figure 8C:
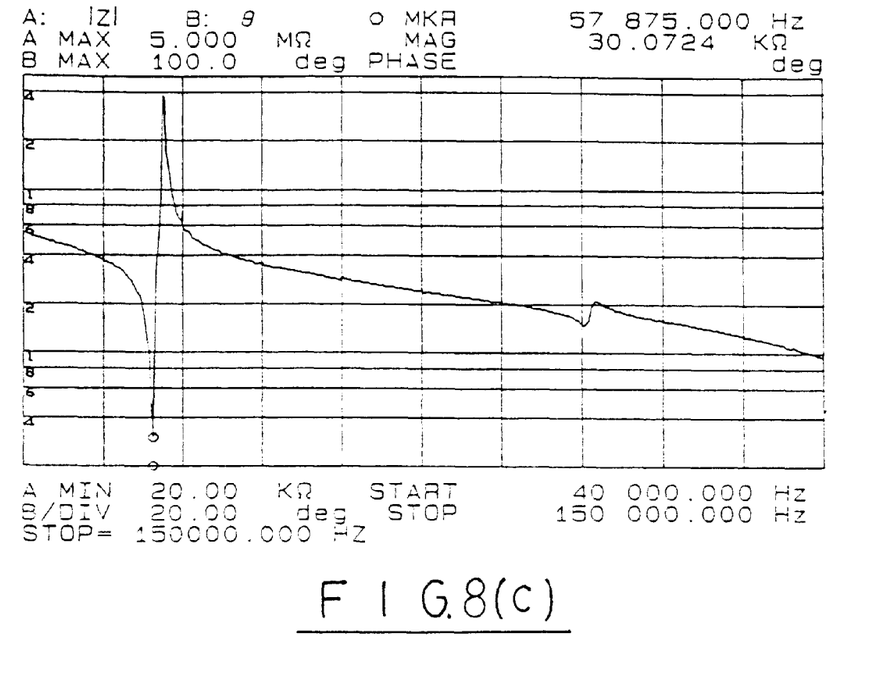
FIG. 8C is a frequency characteristics chart obtained between the output ends according to the present invention.
Figure 8D:
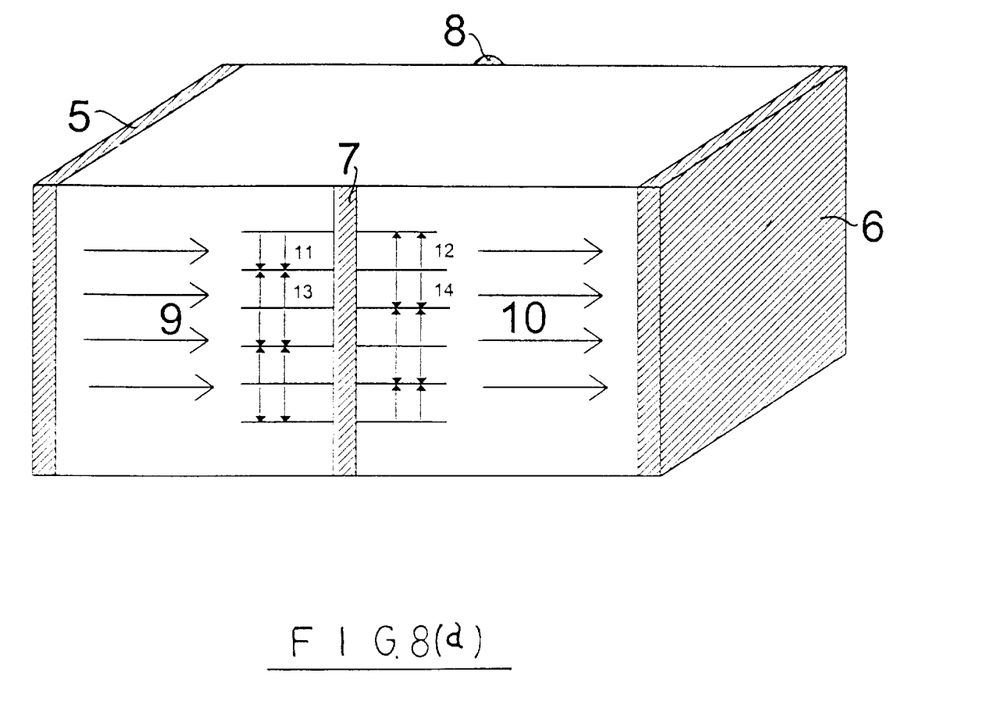
FIG. 8A illustrates same polarity of the output ends of FIG. 4 (9, 10 of same direction).
Figure 9A:
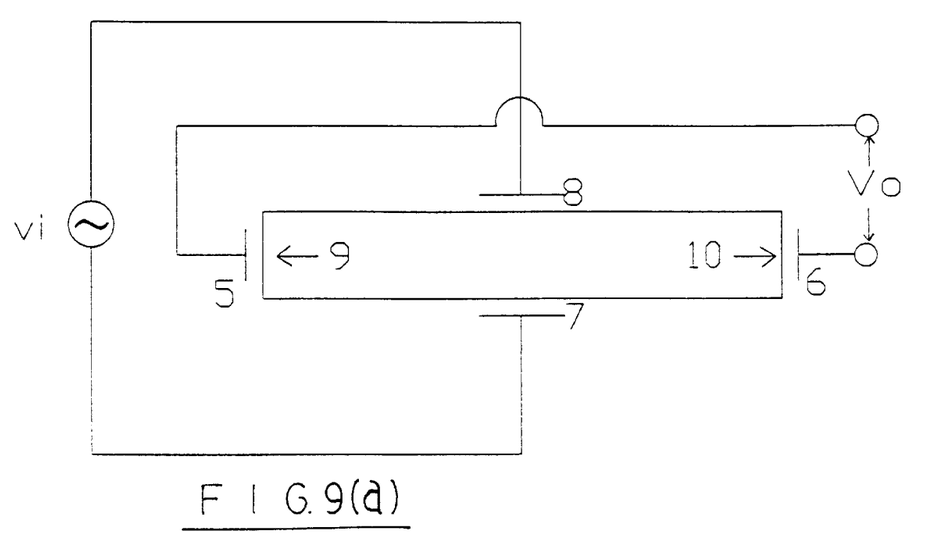
FIG. 9A illustrates the circuit connection of the piezoelectric ceramic transformer of FIG. 8A.
Figure 9B:
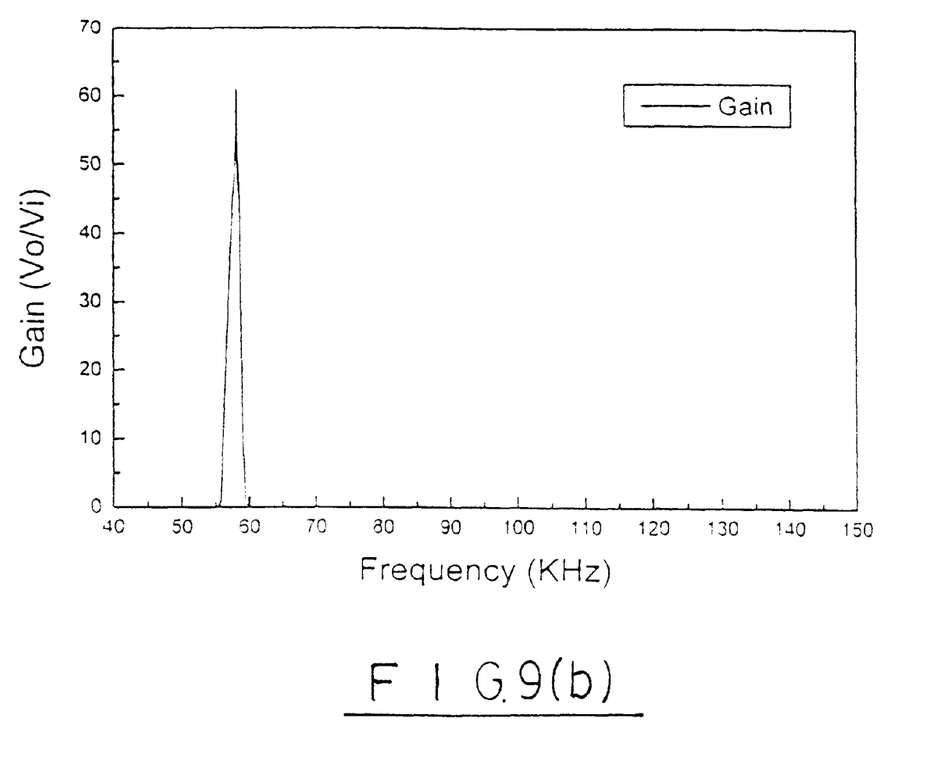
FIG. 9B illustrates voltage output produced in the half-wave resonant mode when the footing ratio of the circuit of FIG. 9A at different frequencies under the load of 50 kΩ.

When the polarities 9 and 10 shown in FIG. 8A are identical, the frequency characteristics between the input terminal electrodes 7 and 8 are as shown in FIG. 8B, and the frequency characteristics between the input terminal electrodes 5 and 6 are as shown in FIG. 8C. FIG. 9A shows the circuit diagram of the piezoelectric ceramic transformer shown in FIG. 8A. When the load is at 50 kΩ, the boost ratio ($V_0/V_1$) at different frequencies of the circuit shown in FIG. 9A provides a voltage output only at the half-wave resonant mode (see FIG. 9B).

Figure 10:
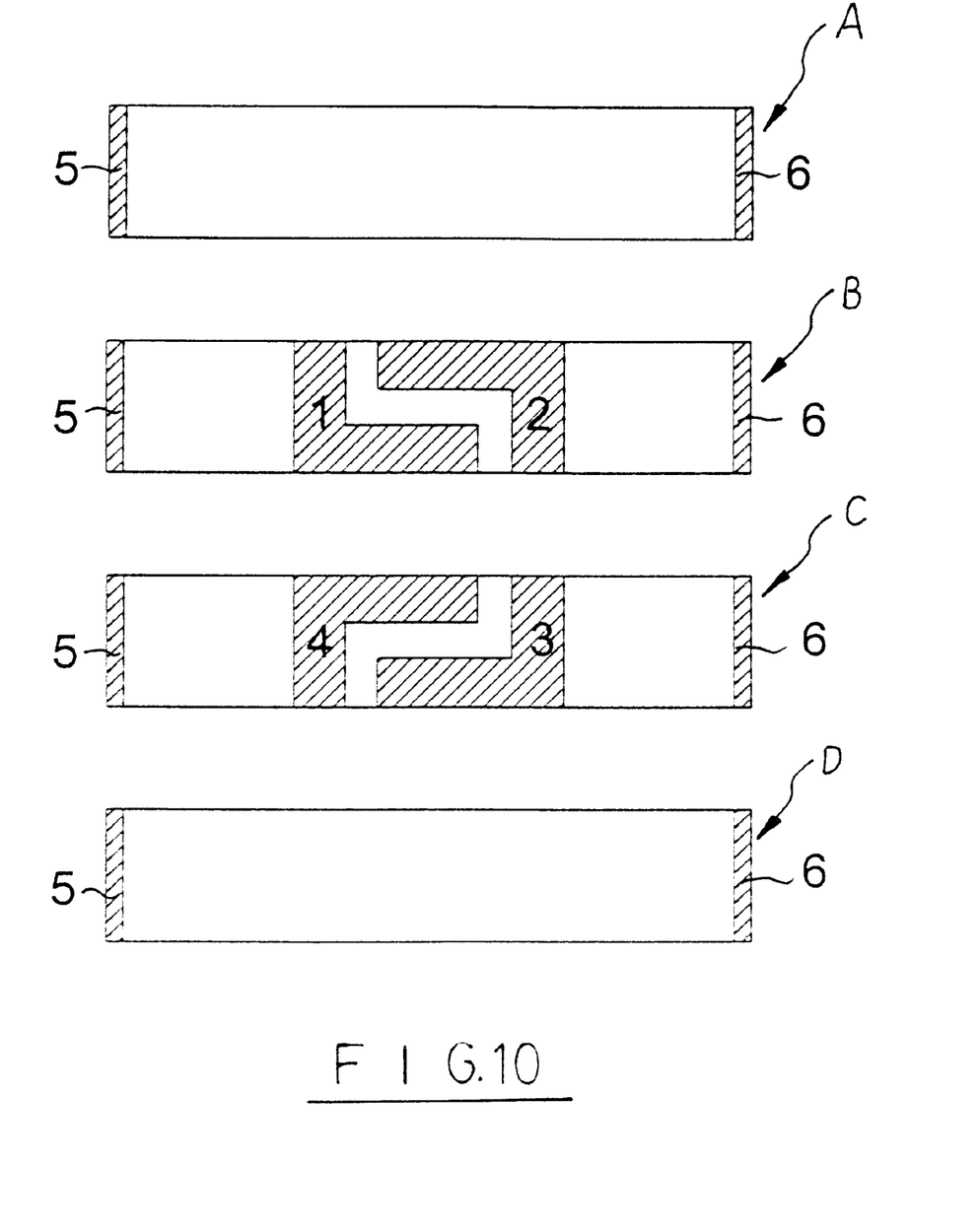
FIG. 10 illustrates an alternate form of the piezoelectric ceramic blank according to the present invention (A: top cover layer, B: odd-number layer, C: even-number layer, D: bottom cover layer) according to the present invention.

In addition to the embodiment shown in FIG. 2, the blank structure can be alternatively embodies as shown in FIG. 10. According to this alternate form, the inner electrode layers 1 and 3 of the odd-number layer B and the even-number layer C have a L-shaped profile symmetrical to the shape of the inner electrode layers 2 and 4.

Figure 11A:
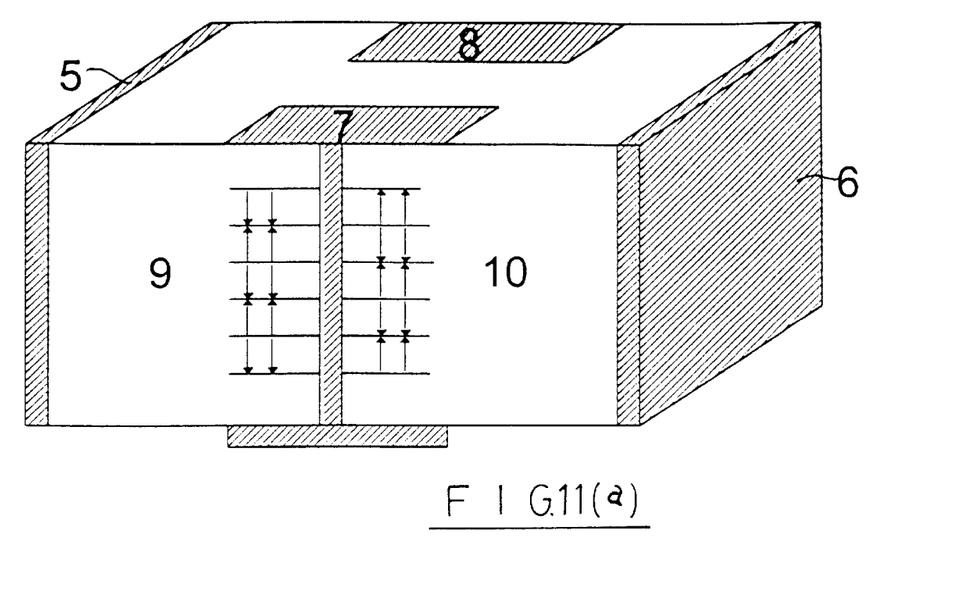
FIG. 11A is a perspective view showing the input terminal electrodes extended to the top and bottom sides of the sintered stack of piezoelectric ceramic blanks according to the present invention.
Figure 11B:
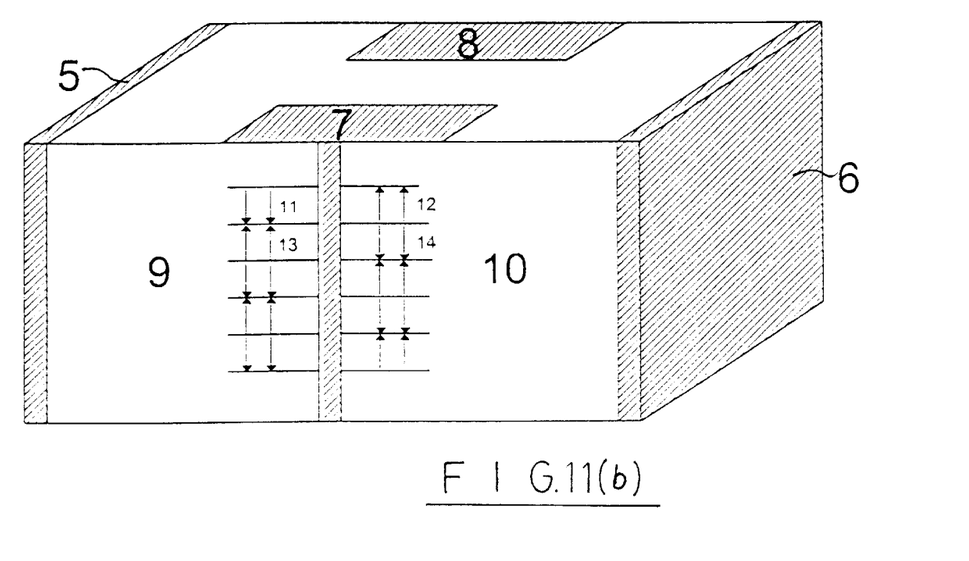
FIG. 11B is a perspective view showing the input terminal electrodes extended to the topside of the sintered stack of piezoelectric ceramic blanks according to the present invention.
Figure 12A:
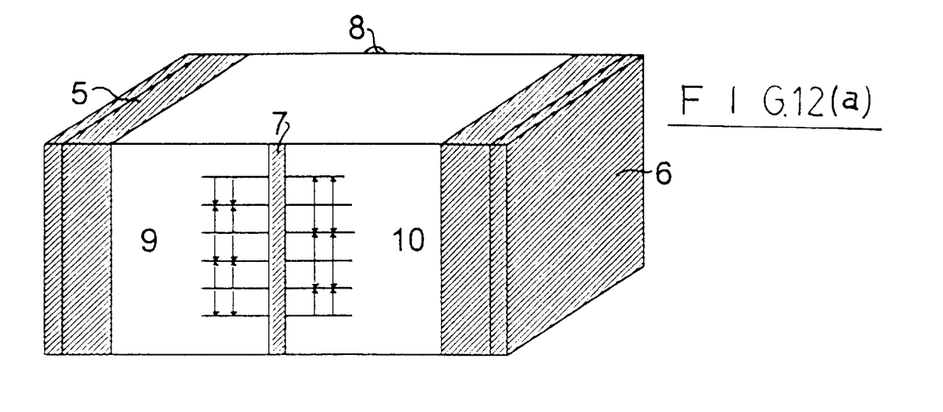
FIG. 12A is a perspective view showing the output terminal electrodes extended to the top and bottom sides and two opposite lateral sides of the sintered stack of piezoelectric ceramic blanks according to the present invention.
Figure 12B:
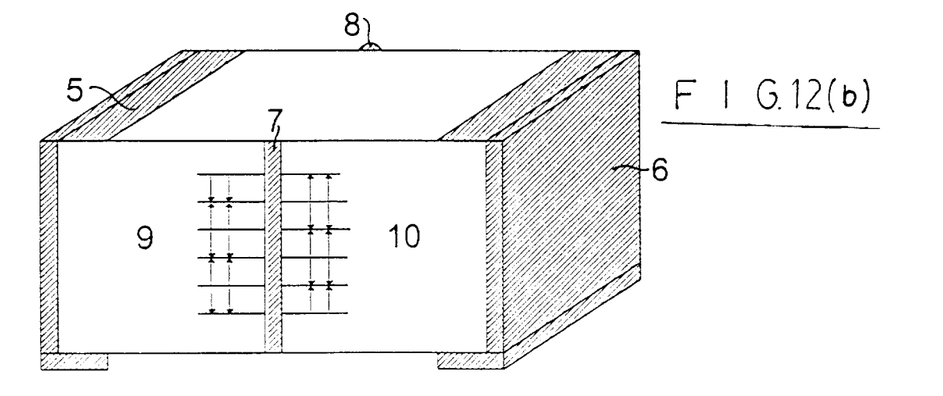
FIG. 12B is a perspective view showing the output terminal electrodes extended to the top and bottom sides of the sintered stack of piezoelectric ceramic blanks according to the present invention.
Figure 12C:
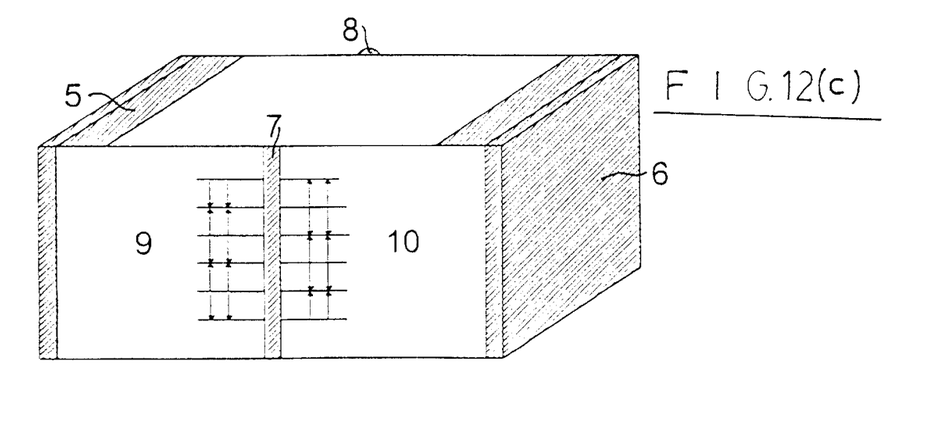
FIG. 12C is a perspective view showing the output terminal electrodes extended to the topside of the sintered stack of piezoelectric ceramic blanks according to the present invention.

Further, the input terminal electrodes 7 and 8 can be extended to the blank area of the top and bottom cover layers A and D (see FIG. 11A) or extended to the blank area of the top cover layer A or bottom cover layer D only (see FIG. 11B); the output terminal electrodes 5 and 6 can be extended to the top and bottom sides as well as the two opposite lateral sides (see FIG. 12A), or to the top and bottom sides (see FIG. 12B), or the top or bottom side only (see FIG. 12C) to facilitate the soldering and support.

By means of alternative arrangement of input terminal electrodes in the piezoelectric ceramic transformer, the ½ wavelength resonant mode is enhanced, and the full-wavelength resonant mode is prohibited and eliminated, and therefore the efficiency of conversion is improved up to over 95%.

It is to be understood that the drawings are designed for purposes of illustration only, and are not intended for use as a definition of the limits and scope of the invention disclosed.

What the invention claimed is:

1. A multi-layer piezoelectric center-drive ceramic transformer comprising a plurality of piezoelectric ceramic blanks disposed in a stack, said piezoelectric ceramic blanks each comprising a top cover layer, a bottom cover layer and at least one odd-number layer and at least one even-number layer alternatively sandwiched in between said top cover layer and said bottom cover layer, first and second inner electrode layers of reversed polarities respectively printed on said at least one odd-number layer, third and fourth inner electrode layers of reversed polarities respectively arranged on said at least one even-number layer, first and second output terminal electrodes respectively arranged on two distal ends of the at least one odd-number layer and at least one even-number layer of each of said piezoelectric ceramic blanks, and first and second input terminal electrodes respectively arranged on two opposite lateral sides of each of the at least one odd-number layer and at least one even-number layer of each of said piezoelectric ceramic blanks, the first input terminal electrodes of the at least one odd-number layer and at least one even-number layer of each of said piezoelectric ceramic blanks being respectively connected to said first inner electrode layers and said third inner electrode layers, the second input terminal electrodes of the at least one odd-number layer and even-number layer of each of said piezoelectric ceramic blanks being respectively connected to said second inner electrode layers and said fourth inner electrode layers.

2. The multi-layer piezoelectric center-drive ceramic transformer of claim 1, wherein the top cover layer and bottom cover layer of each said piezoelectric ceramic blanks are maintained in blank without electrodes.

3. The multi-layer piezoelectric center-drive ceramic transformer of claim 1, wherein said first, second, third and fourth inner electrodes and said input terminal electrode and said output terminal electrodes are respectively printed on the top cover layer and bottom cover layer of each of said piezoelectric ceramic blanks.

4. The multi-layer piezoelectric center-drive ceramic transformer of claim 1, wherein said first, second, third and fourth inner electrodes have a trapezoidal shape, and the first and second inner electrodes of each odd-number layer of each of said piezoelectric ceramic blanks are respectively disposed symmetrical to the third and fourth inner electrodes of each even-number layer of each of said piezoelectric ceramic blanks.

5. The multi-layer piezoelectric center-drive ceramic transformer of claim 1, wherein said first, second, third and fourth inner electrodes have a L-shaped profile, and the first and second inner electrodes of each odd-number layer of each of said piezoelectric ceramic blanks are respectively disposed symmetrical to the third and fourth inner electrodes of each even-number layer of each of said piezoelectric ceramic blanks.

6. The multi-layer piezoelectric center-drive ceramic transformer of claim 1, wherein said input terminal electrodes are respectively extended to the top cover layer and bottom cover layer of each of said piezoelectric ceramic blanks.

7. The multi-layer piezoelectric center-drive ceramic transformer of claim 1, wherein said input terminal electrodes are respectively extended to one of the top cover layer and bottom cover layer of each of said piezoelectric ceramic blanks.

8. The multi-layer piezoelectric center-drive ceramic transformer of claim 1, wherein said output terminal electrodes are respectively extended to top, bottom and two opposite lateral sides of each of the top cover layer, at least one odd-number layer, at least one even-number layer and bottom cover layer of each of said piezoelectric ceramic blanks.

9. The multi-layer piezoelectric center-drive ceramic transformer of claim 1, wherein said output terminal electrodes are respectively extended to top and bottom sides of each of the top cover layer, at least one odd-number layer, at least one even-number layer and bottom layer of each of said piezoelectric ceramic blanks.

10. The multi-layer piezoelectric center-drive ceramic transformer of claim 1, wherein said output terminal electrodes are respectively extended to one of top and bottom sides of each of the top of cover layer, at least one odd-number layer, at least one even-number layer and bottom cover layer of each of said piezoelectric ceramic blanks.

11. The multi-layer piezoelectric center-drive ceramic transformer of claim 1, wherein the ceramic blocks are sintered in said stack.

12. The multi-layer piezoelectric center-drive ceramic transformer of claim 1, wherein the first and second inner electrode layers are printed on said at least one odd-number layer, wherein the third and fourth inner electrode layers are printed on said at least one even-number layer, wherein the first and second output terminal electrodes are printed on said two distal ends of the at least one odd-number layer and wherein said first and second input terminal electrodes are printed on said two opposite lateral sides of each of the at least one odd-number layer and at least one even-number layer of each of said piezoelectric ceramic blanks.

* * * * *